United States Patent
Choi et al.

(10) Patent No.: US 8,013,326 B2
(45) Date of Patent: Sep. 6, 2011

(54) ORGANIC THIN FILM TRANSISTOR SUBSTRATE AND METHOD OF MANUFACTURE

(75) Inventors: Tae-Young Choi, Seoul (KR); Seong-Sik Shin, Seongnam-si (KR); Bo-Sung Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 346 days.

(21) Appl. No.: 12/191,849

(22) Filed: Aug. 14, 2008

(65) Prior Publication Data

US 2009/0072228 A1 Mar. 19, 2009

(30) Foreign Application Priority Data

Sep. 19, 2007 (KR) .................. 10-2007-0095034

(51) Int. Cl.
*H01L 21/84* (2006.01)
*H01L 27/28* (2006.01)

(52) U.S. Cl. .................. 257/40; 257/E27.117; 257/59; 438/158

(58) Field of Classification Search .................. 257/40, 257/59, 72, E51.001–E51.052, E27.117–E27.119; 438/99, 158–159
See application file for complete search history.

(56) References Cited

U.S. PATENT DOCUMENTS

| | | | | |
|---|---|---|---|---|
| 5,867,233 A * | 2/1999 | Tanaka | ............................ | 349/43 |
| 5,990,998 A * | 11/1999 | Park et al. | ..................... | 349/139 |
| 6,661,024 B1 * | 12/2003 | Zhang et al. | ..................... | 257/40 |
| 7,005,331 B2 * | 2/2006 | Chen | ............................ | 438/158 |
| 7,019,328 B2 * | 3/2006 | Chabinyc et al. | ................ | 257/40 |
| 7,067,841 B2 * | 6/2006 | Parker | .............................. | 257/40 |
| 2004/0129936 A1 * | 7/2004 | Park et al. | ..................... | 257/40 |
| 2005/0282402 A1 * | 12/2005 | Kim | ............................ | 438/780 |
| 2006/0145146 A1 * | 7/2006 | Suh et al. | ......................... | 257/40 |
| 2007/0018162 A1 * | 1/2007 | Song et al. | ..................... | 257/59 |

FOREIGN PATENT DOCUMENTS

| | | |
|---|---|---|
| JP | 10-268343 | 3/1997 |
| JP | 2006-163418 | 6/2006 |
| JP | 2006-332660 | 7/2006 |
| JP | 2006-261538 | 9/2006 |

* cited by examiner

*Primary Examiner* — Matthew W Such

(74) *Attorney, Agent, or Firm* — Innovation Counsel LLP

(57) ABSTRACT

An organic thin film transistor substrate includes a gate electrode formed on a substrate, a gate insulation layer formed on the gate electrode to have a source-connecting portion and a drain-seating groove, a source electrode formed in the source-connecting portion, a drain electrode formed in the drain-seating groove and an organic semiconductor layer contacting the gate insulation layer, the source electrode and the drain electrode.

16 Claims, 16 Drawing Sheets

ORGANIC THIN FILM TRANSISTOR SUBSTRATE AND METHOD OF MANUFACTURE

CROSS-REFERENCE TO RELATED APPLICATIONS

The present application claims priority of Korean Patent Application No. 10-2007-0095034, filed on Sep. 19, 2007, the disclosure of which is incorporated by reference in its entirety.

BACKGROUND OF DISCLOSURE

1. Field of the Invention

The present disclosure relates to an organic thin film transistor substrate having a flat structure, and a method of manufacturing the organic thin film transistor substrate.

2. Description of the Related Art

Small and light flat panel display devices include liquid crystal display (LCD) devices, organic light emitting display (OLED) devices, electrophoretic display (EPD) devices, plasma display panels (PDPs), etc. The flat panel display device includes a pair of electric field generating electrodes and an electro-optical active layer disposed between the electrodes. The electro-optical active layer includes a liquid crystal layer in the LCD device and an organic light-emitting layer in the OLED device.

One of the electric field generating electrodes is connected to a switching element to receive an electric signal which the electro-optical active layer converts into an optical signal, thereby to display desired images.

In the flat panel display device, a thin film transistor (TFT) is used as a switching element. The flat panel display device includes a gate line that supplies a gate-driving signal for controlling the TFT and a data line that supplies a pixel voltage signal to a pixel electrode.

A conventional organic TFT that has source and drain electrodes formed on a gate insulation layer tends to experience changes in the properties of an organic semiconductor layer formed on the source and drain electrodes due to the difference in height of the source and drain electrodes.

SUMMARY OF THE INVENTION

Exemplary embodiments of the present invention provide an organic TFT substrate whose organic semiconductor layer does not exhibit changes in properties and whose manufacturing process is simplified by forming its source and drain electrodes in a gate insulation layer.

Such an organic thin film transistor substrate may includes a gate electrode formed on a substrate, a gate insulation layer formed on the gate electrode, the gate insulation layer having a source-connecting portion and a drain-seating groove, a source electrode formed in the source-connecting portion, a drain electrode formed in the drain-seating groove, and an organic semiconductor layer contacting the gate insulation layer, the source electrode and the drain electrode.

Surfaces of the gate insulation layer, the source electrode and the drain electrode that contact the organic semiconductor layer may be substantially formed on the same plane.

The organic thin film transistor substrate may further include a gate line connected to the gate electrode, a data line connected to the source electrode, and a pixel electrode connected to the drain electrode.

The data line may be formed on the substrate.

The data line may include a first data line and a second data line which are disconnected to each other to insulate the data line from the gate line.

The organic thin film transistor substrate may further include a data bridge electrode to connect the first data line to the second data line.

The data bridge electrode may be formed in a bridge groove arranged in the gate insulation layer.

The bridge groove may include first and second contact holes exposing portions of the first and the second data lines, respectively, and a connecting groove connecting the first contact hole to the second contact hole, wherein the first data line is connected to the second data line through the first and second contact holes.

The source-connecting portion may include a third contact hole exposing a portion of the data line, and a source-seating groove connected to the third contact hole and facing the drain-seating groove.

The organic thin film transistor substrate may further include an organic protective layer that has a fourth contact hole exposing a portion of the drain electrode.

The method of manufacturing an organic thin film transistor substrate may include forming a gate electrode on a substrate, forming a gate insulation layer on the gate electrode, the gate insulation layer having a source-connecting portion and a drain-seating groove, forming a source electrode in the source-connecting portion, forming a drain electrode in the drain-seating groove, and forming an organic semiconductor layer to be connected to the source electrode and the drain electrode.

Forming the gate insulation layer may include preparing a bridge groove, the source-connecting portion and the drain-seating groove on the gate electrode.

Forming the gate insulation layer comprises, forming an insulation layer by depositing an insulation material on the gate electrode, arranging an imprint mold having a different thickness over the insulation layer, pressurizing and removing the imprint mold, and removing the insulation layer remaining in areas where the bridge groove, the source-connecting portion, and the drain-seating groove are to be formed by using an etching process to form a bridge groove, a source-connecting portion, and a drain-seating groove.

Forming the gate insulation layer may include forming an insulation layer by depositing an insulation material on the gate electrode, forming a resin layer on the insulation layer, arranging an imprint mold over the resin layer, pressurizing the imprint mold to form a resin pattern having a different thickness, removing the imprint mold, and etching the insulation layer using the resin pattern to form the bridge groove, the source-connecting portion and the drain-seating groove.

Forming the gate insulation layer may include forming an insulation layer by depositing an insulation material on the gate electrode, etching the insulation layer using a first mask formed on the insulation layer to form first, second, and third contact holes through which the data line is exposed, and etching the insulation layer having the first, second and third contact holes using a second mask formed on the insulation layer to form a connecting groove, a source-seating groove, and a drain-seating groove.

Forming the source electrode and the drain electrode may include forming a bridge electrode, the source electrode, and the drain electrode in the bridge groove, the source-connecting portion, and the drain-seating groove, respectively.

The method of manufacturing the organic thin film transistor substrate may further include surface processing the gate insulation layer, the source electrode, and the drain electrode after the forming the source and drain electrodes.

Such surface processing may include performing a plasma treatment on the surface of the gate insulation layer, the source electrode, and the drain electrode with supplying a gas containing fluorine (F).

Such surface processing may include self-assembled monolayer (SAM)-processing the surfaces of the gate insulation layer, the source electrode, and the drain electrode.

The method of manufacturing the organic thin film transistor substrate may further include forming an organic protective having a fourth contact hole through which a portion of the drain electrode is exposed.

BRIEF DESCRIPTION OF THE DRAWINGS

The above and other features and advantages of the present invention will become more apparent from the following detailed description when taken in conjunction with the accompanying drawings, in which.

DETAILED DESCRIPTION OF THE EXEMPLARY EMBODIMENTS

The exemplary embodiments of the present invention will now be described with reference to the accompanying drawings.

Figure 1:
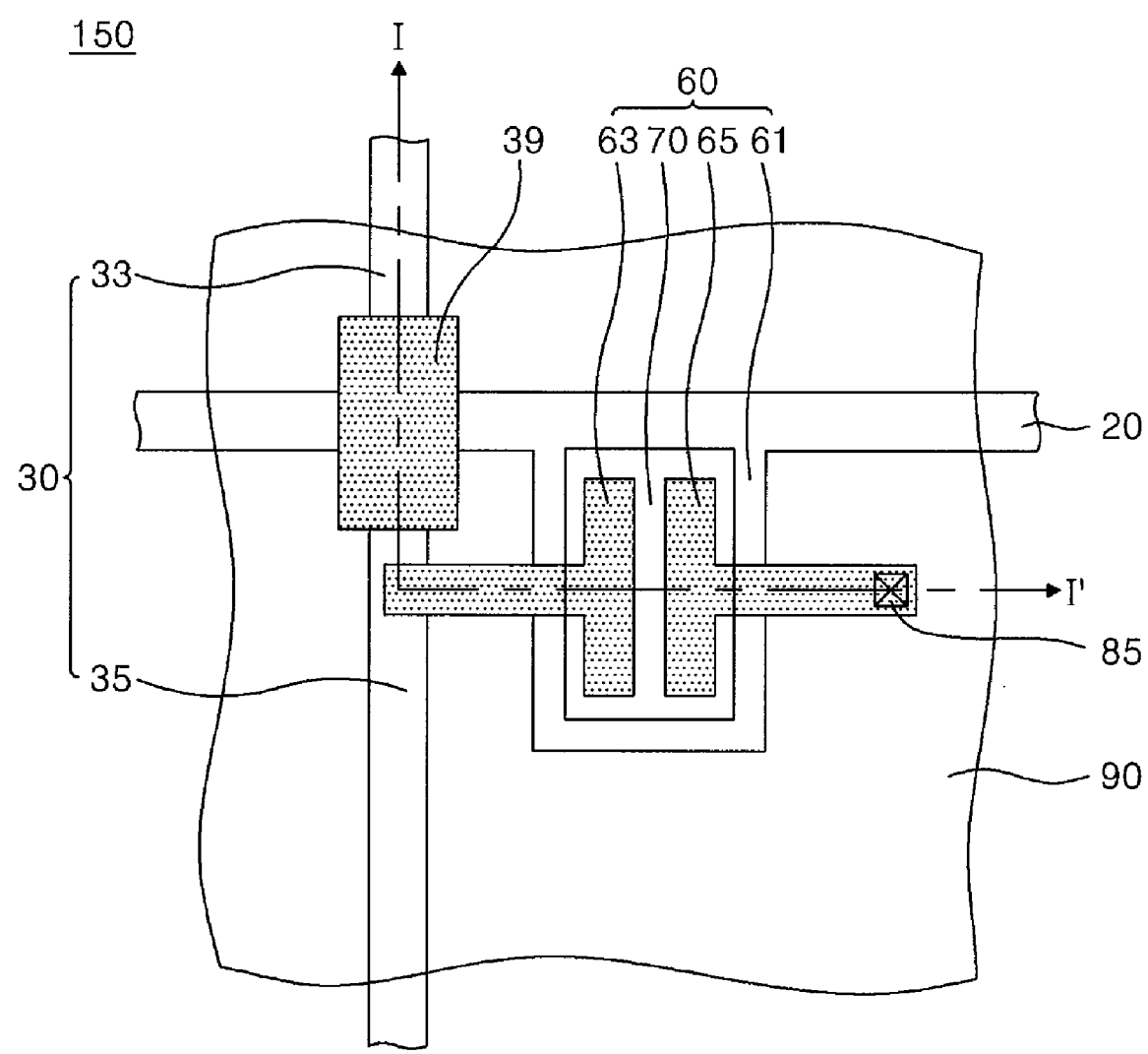
FIG. 1 is a plan view illustrating an organic TFT substrate according to an exemplary embodiment of the present invention.
Figure 2:
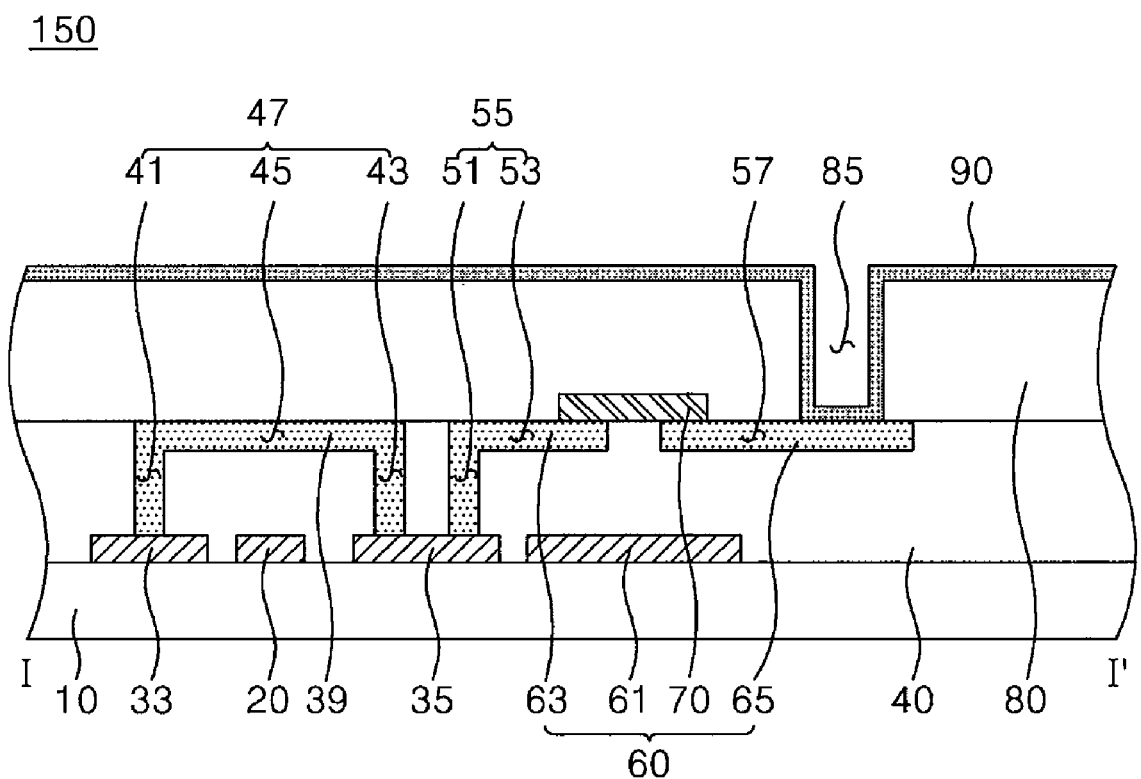
FIG. 2 is a cross-sectional view taken along the line I-I' of the organic TFT substrate of FIG. 1.

FIG. 1 is a plan view illustrating an organic TFT substrate according to an exemplary embodiment of the present invention and FIG. 2 is a cross-sectional view taken along the line I-I' of the organic TFT substrate of FIG. 1.

The organic TFT substrate 150 includes a substrate 10, a gate line 20, a data line 30, a gate insulation layer 40, a data bridge electrode 39, an organic TFT 60, an organic protective layer 80, and a pixel electrode 90.

The gate line 20 receives a gate-driving signal from a gate driver (not shown). The gate line 20 is formed of a metal or its alloy on the substrate 10 in a single or multi layer structure. The metal includes any one of molybdenum (Mo), cupper (Cu), aluminum (Al), Chromium (Cr), silver (Ag), tungsten (W) and tantalum (Ta) and an alloy thereof.

The data line 30 receives a pixel voltage signal from a data driver (not shown). The data line 30 is formed perpendicular to the gate line 20 on the substrate 10. The data line 30 is formed of the same material as that of the gate line 20. The data line 30 includes a first data line 33 and a second data line 35. The first data line 33 and the second data line 35 are disconnected to each other in the intersection of the gate line 20 and data line 30, so that the data line 30 is insulated from the gate line 20.

The gate insulation layer 40 is formed on the gate line 20 and data line 30 to insulate the gate line 20 from the data line 30. The gate insulation layer 40 includes a bridge groove 47, a source-connecting portion 55, and a drain-seating groove 57. The bridge groove 47 is formed between the first and second data lines 33 and 35. The bridge groove 47 includes a first contact hole 41, a second contact hole 43, and a connecting groove 45. The first and second contact holes 41 and 43 exposes the first and second data lines 33 and 35, respectively, and the connecting groove 45 connects the first contact hole 41 to the second contact hole 43. The source-connecting portion 55 includes a third contact hole 51 and a source-seating groove 53. The contact hole 51 exposes the second data line 35 and the source-seating groove 53 is connected to the third contact hole 51 and overlaps a portion of a gate electrode 61. The drain-seating groove 57 faces the source-seating groove 53 and overlaps the portion of the gate electrode 61.

The gate insulation layer 40 may made of an organic material such as an imide-based polymer including polyimide, a vinyl alcohol-based polymer including polyvinyl alcohol, parylene, polyvinyl pyrrolidone (PVP), polyfluorane, polyvinyl acetate (PVA), a phenol-based polymer, an acrylic-based polymer, an allyl ether-based polymer, and a fluorine-based polymer. Also, the gate insulation layer 40 may be made of an inorganic material, such as a silicon oxide surface-processed with octadecyl trichloro-silane (OTS).

The data bridge electrode 39 connects the first data line 33 to the second data line 35. The data bridge electrode 39 is formed in the bridge groove 47 that is provided in the gate insulation layer 40.

The organic TFT 60 supplies the pixel voltage signal from the data line 30 to the pixel electrode 90 in response to the gate-driving signal that is supplied from the gate line 20. The organic TFT 60 includes a gate electrode 61, a source electrode 63, and a drain electrode 65. The gate electrode 61 is extended from the gate line 60. The source electrode 63 that is formed in the source-connecting portion 55 is connected to the data line 30 through the third contact hole 51 of the source-connecting portion 55. The drain electrode 65 faces the source electrode 63 and is formed in the drain-seating groove 57.

The organic TFT 60 includes an organic semiconductor layer 70. The organic semiconductor layer 70 overlaps the gate electrode 61, with the gate insulation layer 40 disposed between the layer 70 and the electrode 61, and forms a channel between the source electrode 63 and the drain electrode 65. The organic semiconductor layer 70 partially contacts the source electrode 63 and the drain electrode 65.

The organic semiconductor layer 70 is formed, for example, by performing a surface-treatment, such as a plasma treatment or self-assembled monolayer (SAM) treatment, on the gate insulation layer 40, the source electrode 63, and the drain electrode 65 which are overlapped with the gate electrode 61. By doing so, the contact angles between the organic semiconductor layer 70 and the gate insulation layer 40, between the organic semiconductor layer 70 and the source electrode 63, and between the organic semiconductor layer 70 and the drain electrode 65 can be substantially all the same. This may prevent a to-be-applied organic semiconductor material from spreading.

Accordingly, the organic semiconductor layer 70 may be formed on the gate insulation layer 40, the source electrode 63 and the drain electrode 65. The organic semiconductor layer 70 may be formed without providing a dot hole (not shown) in a bank insulation layer (not shown), and therefore, a photoresist process need not be performed, thereby reducing the time and expense required to manufacture the organic TFT substrate 150.

In the organic TFT 50, the source electrode 63 is formed in the source-connecting portion 55 and the drain electrode 65 is formed in the drain-seating groove 57, so that changes in property of the organic semiconductor layer 70 can be prevented.

The organic semiconductor layer 70 may be made of an organic insulation material such as polyvinyl acetate (PVA), pentacene, tetracene, anthracene, naphthalene, $\alpha$-6T, $\alpha$-4T, perylene and a derivative thereof, rubrene and a derivative thereof, coronene and a derivative thereof, perylene tetracarboxylic diimide and a derivative thereof, perylenetetracarboxylic dianhydride and a derivative thereof, phthalocyanine and a derivative thereof, naphthalene tetra-carboxylic diimide and a derivative thereof, naphthalene tetra-carboxylic dianhydride and a derivative thereof, a conjugated polymer derivative substituted or non-substituted with thiophene, and a conjugated polymer derivative substituted with fluorine.

The organic protective layer 80 is formed on the gate insulation layer 40 and the organic TFT 60 to protect the organic TFT 60. The organic protective layer 80 includes a fourth contact hole 85 exposing a portion of the drain electrode 65. The organic protective layer 80 may be made of at least one of benzocyclobutene (BCB), an acryl-based organic compound, fluoropolyarrylether (FPAE), perfluorocyclobutene (PFCB), cytop, and a combination thereof.

The pixel electrode 90 is formed on the organic protective layer 80. The pixel electrode 90 is connected to the portion of the drain electrode 65 through the fourth contact hole 85 provided in the organic protective layer 80. The pixel electrode 90 may display images in response to the pixel voltage signal supplied from the drain electrode 65. The pixel electrode 90 is formed of a transparent conductive material or a reflective conductive material. The transparent conductive material includes an indium tin oxide ("ITO"), a tin oxide ("TO"), an indium zinc oxide ("IZO"), or an indium tin zinc oxide ("ITZO").

A fabrication method of an organic TFT substrate according to an exemplary embodiment will be described in detail with reference to FIGS. 3 to 17.

Figure 3:
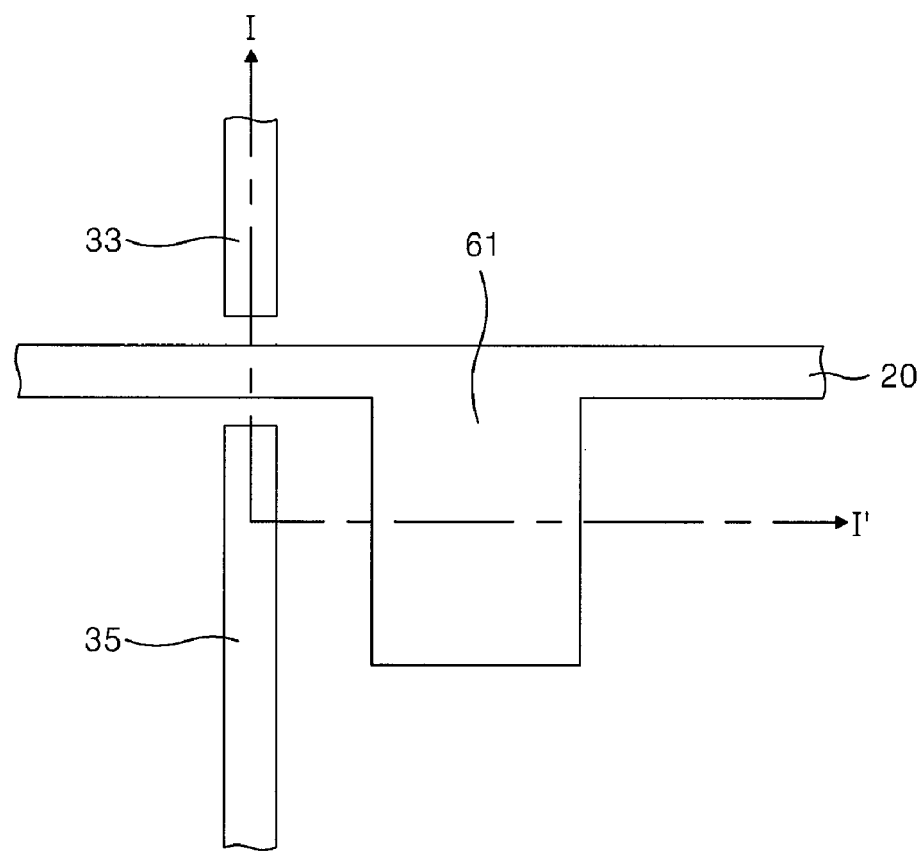
FIG. 3 and FIG. 4 are a plan view and a cross-sectional view, respectively, for describing a process of forming a conductive metal pattern according to an exemplary embodiment of the present invention.
Figure 4:
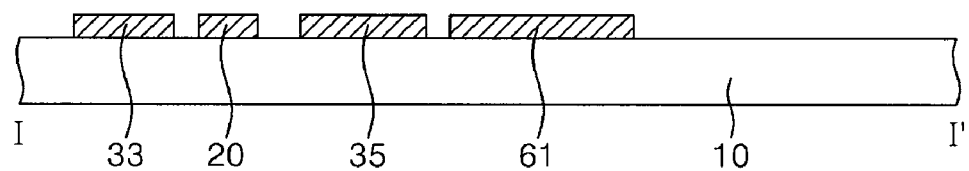

FIG. 3 and FIG. 4 are a plan view and a cross-sectional view, respectively, for describing a process of forming a conductive metal pattern according to an exemplary embodiment of the present invention.

Referring to FIG. 3 and FIG. 4, the conductive metal pattern is formed on the substrate 10 including the gate line 20, the first and second data lines 33 and 35, and the gate electrode 61. More specifically, a conductive layer is formed on the substrate 10 by a deposition method such as sputtering. The conductive layer is formed in a single or multi layer, of at least one of molybdenum (Mo), niobium (Nb), cupper (Cu), aluminum (Al), chromium (Cr), silver (Ag), tungsten (W) and tantalum (Ta) or an alloy thereof. And then, the conductive metal pattern is complete by patterning the conductive layer by a photolithography process and an etching process.

Figure 5:
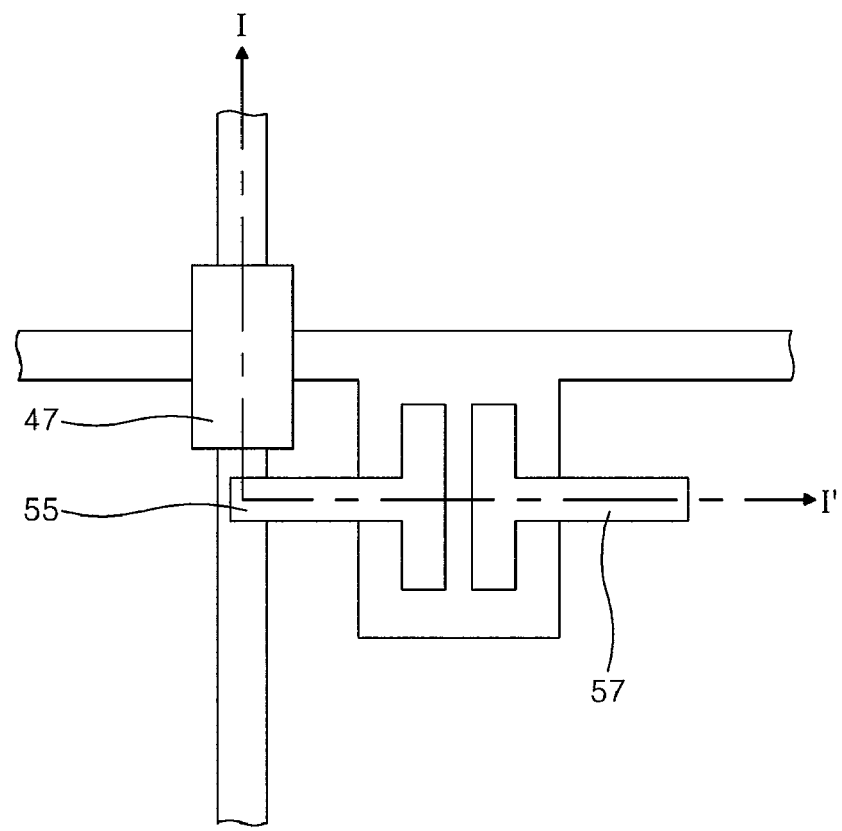
FIG. 5 and FIG. 6 are a plan view and cross-sectional view, respectively, illustrating an organic TFT substrate having a gate insulation layer formed thereon according to an exemplary embodiment of the present invention.
Figure 6:
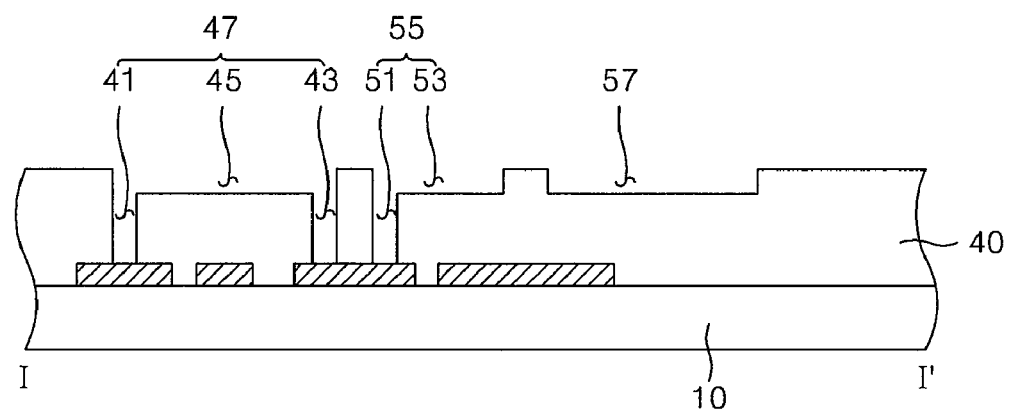

FIG. 5 and FIG. 6 are a plan view and a cross-sectional view, respectively, illustrating an organic TFT substrate having a gate insulation layer formed thereon according to an exemplary embodiment of the present invention.

Referring to FIG. 5 and FIG. 6, the gate insulation layer 40 including the bridge groove 47, the source-connecting portion 55, and the drain-seating groove 57 is formed on the substrate 10 having the conductive metal pattern.

FIG. 7A to FIG. 7E are views illustrating a first exemplary process of forming the gate insulation layer shown in FIG. 5 and FIG. 6.

Figure 7A:
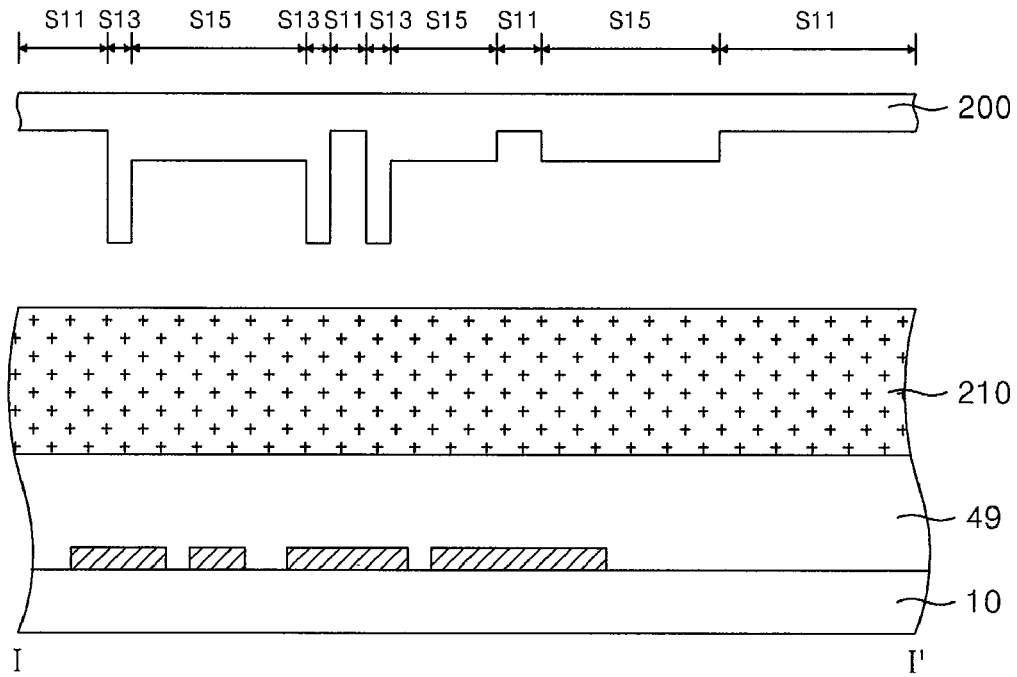
FIG. 7A to FIG. 7E are views illustrating a first exemplary process of forming the gate insulation layer shown in FIG. 5 and FIG. 6.
Figure 7B:
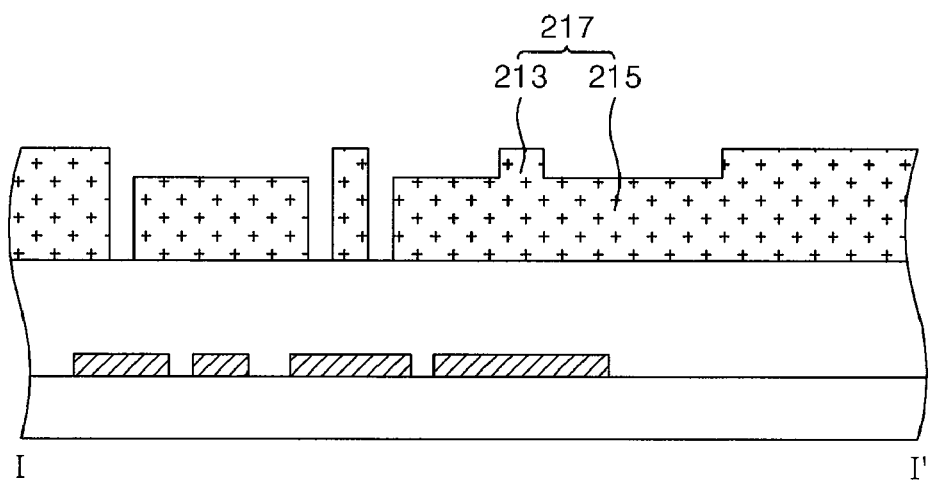

Referring to FIGS. 7A and 7B, an insulation layer 49 and a resin layer 210 are formed on the substrate 10, and an imprint mold 200 is arranged over the resin layer 210. The resin layer 210 is pressurized by the imprint mold 200 to form a resin pattern 217 having a different thickness. More specifically, an insulation material is deposited on the substrate 10 having the conductive metal pattern. The insulation material is deposited by a deposition method such as a plasma enhanced chemical vapor deposition ("PECVD") method, thereby forming the insulation layer 49. And then, the resin layer 210 is formed on the insulation layer 49.

The resin layer 210 may be formed of thermoplastic resin, thermosetting resin, or photo-curable resin according to its formation process. The photo-curable resin includes at least one of urethane-based resin, epoxy-based resin and acryl-based resin. For example, photo-curable resin may include low viscosity ultraviolet-curable resin such as HDDA (1,6-hexanediol-diacrylate) or HEBDM (bis(hydroxyethyl) bisphenol-A dimethacrylate).

The thermosetting resin includes at least one of phenol resin, epoxy resin, silicon resin, and polyimide resin. The thermoplastic resin includes at least one of polymethylmethacrylate (PMMA), polycarbonate (PC), polyethylene terephthalate (PET), and acryl resin.

The imprint mold 200 having the different thickness is arranged over the resin layer 210. The imprint mold 200 includes a first area S11, a second area S13, and a third area S15. Among them, the first area S11 is thinnest, and the second area S13 is thickest. The third area S15 is thicker than the first area S11 but thinner than the second area S13. The first area S11 is located on a portion of the resin layer 210 where an insulation layer 49 is to be remaining. The second area S13 is located on a portion of the resin layer 210 where first, second and third contact holes are to be formed. The third area S15 is located on a portion of the resin layer 210 where a connecting groove 45, a source-seating groove 53, and a drain-seating groove 57 are to be formed.

The resin pattern 217 having the different thickness is formed by pressurizing the resin layer 210 with the imprint mold 200. The resin pattern 217 includes a first resin pattern 213 and a second resin pattern 215. The first resin pattern 213 is formed by pressurizing the resin layer 210 with the first area S11 of the imprint mole 200. The first resin pattern 213 has a larger thickness compared to the second resin pattern 215. The second resin pattern 215 is formed by pressurizing the resin layer 210 with the third area S15 of the imprint mold 200. The second resin pattern 215 has a smaller thickness compared to the first resin pattern 213. The resin layer 210 pressurized by the second area S13 of the imprint mold 200 is removed. Thereafter, the imprint mold 200 is removed.

Figure 7C:
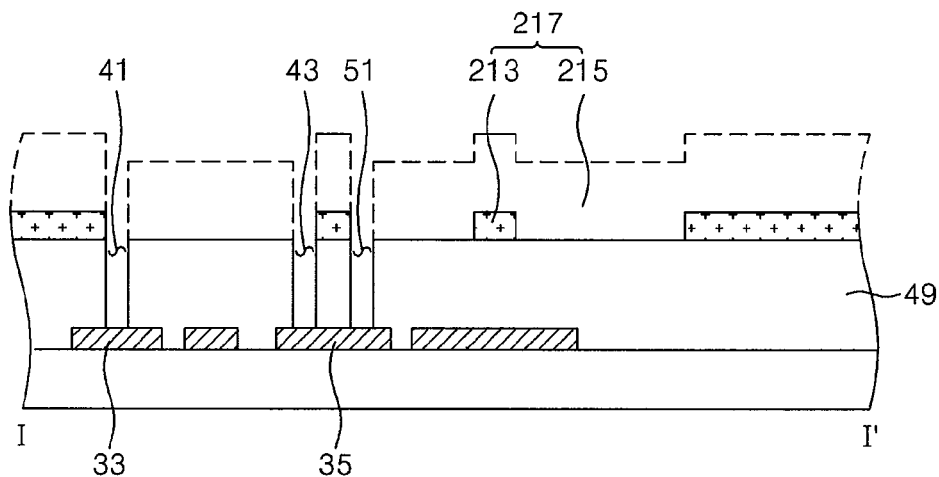

Referring to FIG. 7C, the insulation layer 49 is removed by a first etching process using the first and second resin patterns 213 and 215 as masks to form the first, second and third contact holes 41, 43 and 51. The first and second data lines 33 and 35 are exposed through the first, second and third contact holes 41, 43 and 51. Next, the resin pattern 217 is etched by a dry etching process so as to make the first resin patter 213 thinner and remove the second resin pattern 215 from the resin pattern 217.

Figure 7D:
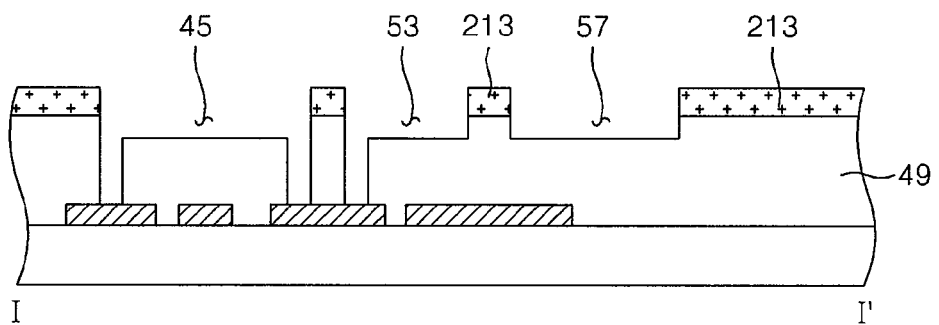

Referring to FIG. 7D, predetermined portions of the insulation layer 49 are etched by a dry etching process using the first resin pattern 213 as a mask and by adjusting an etching time of the dry etching process thereby to form the connecting groove 45, the source-seating groove 53, and the drain-seating groove 57.

Figure 7E:
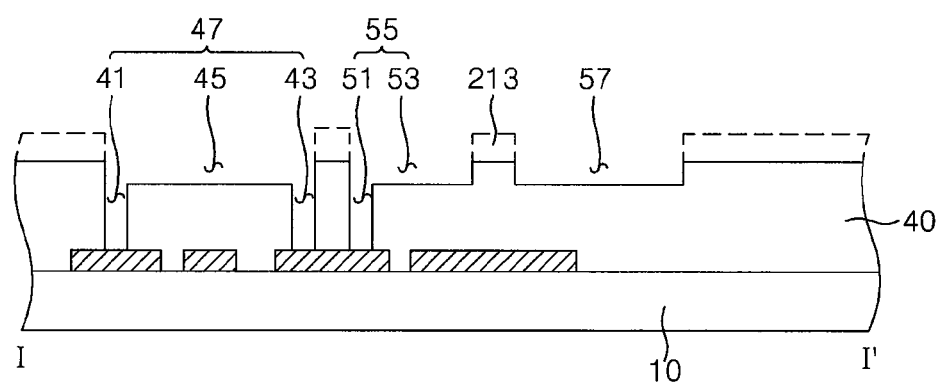

Referring to FIG. 7E, the first resin pattern 213 remaining on the insulation layer 49 is removed by an etching process.

Accordingly, the gate insulation layer 40 including the bridge groove 47, the source-connecting portion 55 and the drain-seating groove 57 is formed on the substrate 10 on which the conductive metal pattern is formed, as illustrated shown in FIG. 5 and FIG. 6. The bridge groove 47 includes the first contact hole 41, the second contact hole 43, and the connecting groove 45. The source-connecting portion 55 includes the third contact hole 51 and the source-seating groove 53.

Figure 8A:
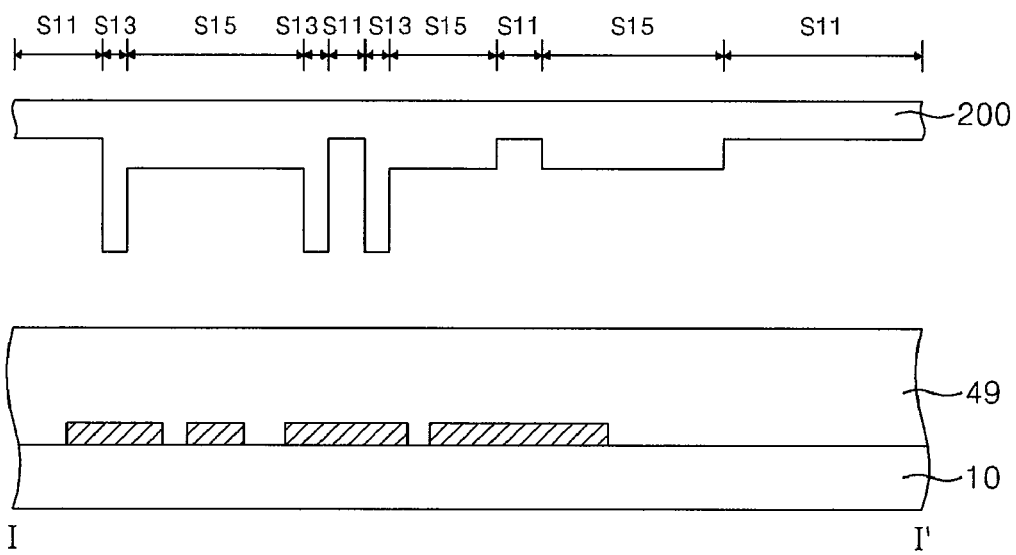
FIG. 8A and FIG. 8B are views illustrating a secondary exemplary process of forming the gate insulation layer shown in FIG. 5 and FIG. 6.
Figure 8B:
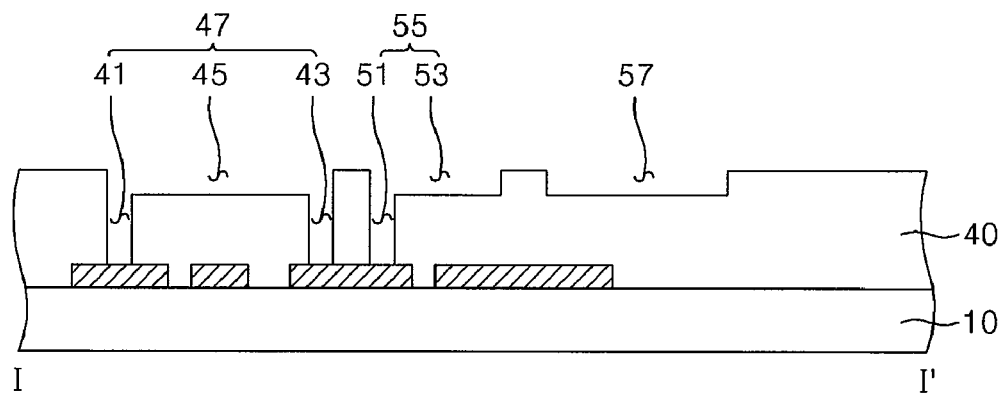

FIG. 8A and FIG. 8B are views a secondary exemplary process of forming the gate insulation layer shown in FIG. 5 and FIG. 6.

Referring to FIG. 8A and FIG. 8B, an insulation layer 49 is formed on a substrate 10, and an imprint mold 200 is arranged over the insulation layer 49. The insulation layer 49 is pressurized by the imprint mold 200 to form an insulation pattern having a different thickness. More specifically, an insulation material is deposited by a deposition method, such as a PECVD method, on the substrate 10 having a conductive metal pattern to form the insulation layer 49. Next, the imprint mold 200 having a different thickness is arranged over the insulation layer 49. The imprint mold 200 includes a first area S11, a second area S13, and a third area S15. The first area S11 is located on portions where the insulation layer 49 is to be remaining. The second area S13 is located on portions where first, second and third contact holes 41, 43 and 51 are to be formed. The third area S15 is located on portions where a connecting groove 45, a source-seating groove 53 and a drain-seating groove 57 are to be formed.

The imprint mold 200 is removed after the insulation layer 49 has been pressurized by the imprint mold 200. Next, predetermined portions of the insulation layer 49 are removed by an etching process to form a gate insulation layer 40. The predetermined portions includes areas where the first contact hole 41, the second contact hole 43, the third contact hole 51, the connecting groove 45, the source-seating groove 53, and the drain-seating groove 57 are to be formed.

Accordingly, the gate insulation layer 40 including a bridge groove 47, a source-connecting portion 55, and the drain-seating groove 57 is formed on the substrate 10 on which the conductive metal pattern is formed as illustrated shown in FIG. 5 and FIG. 6. The bridge groove 47 includes the first contact hole 41, the second contact hole 43, and the connecting groove 45. The source-connecting portion includes the third contact hole 51 and the source-seating groove 53.

FIG. 9A to 9F are views illustrating a third exemplary process of forming the gate insulation layer shown in FIG. 5 and FIG. 6.

Figure 9A:
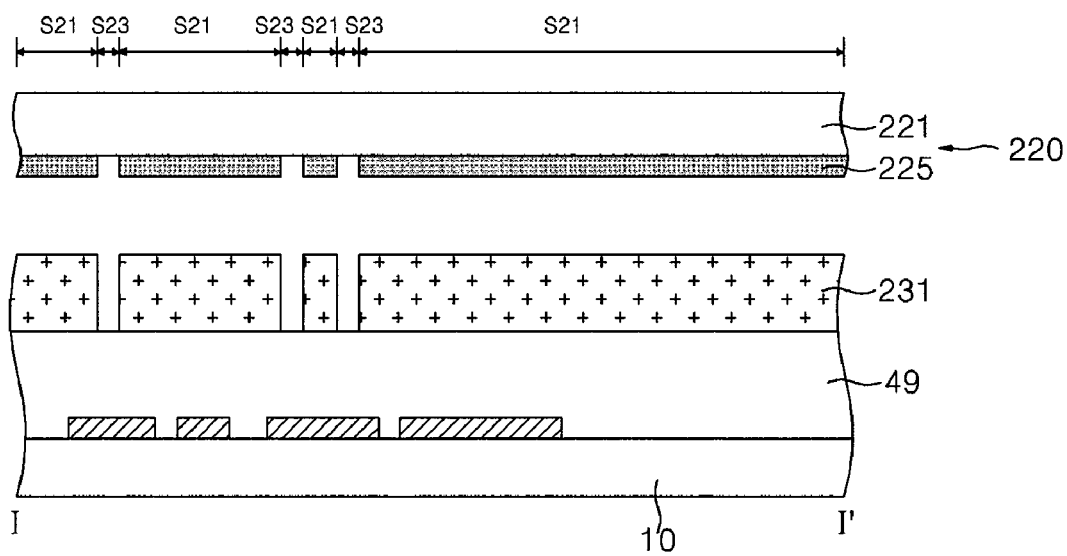
FIG. 9A to 9F are views illustrating a third exemplary process of forming the gate insulation layer shown in FIG. 5 and FIG. 6.

Referring to FIG. 9A, an insulation layer 49 is formed on a substrate 10 on which a conductive metal pattern is formed. A photoresist layer is formed on the insulation layer 49. A first mask 220 is arranged over the photoresist layer. The photoresist layer is subject to exposure and development processes by a photolithography process using the first mask 220, thereby forming a first photoresist pattern 231. The first photoresist pattern 231 includes an opaque area S21 in which a blocking layer 225 is formed on a quartz substrate 221, and a transmission area S23 in which only the quartz substrate 221 exists. The opaque area S21 cuts off ultraviolet rays during the exposure process. After the development process, the first photoresist pattern 231 remains on the insulation layer 49 of areas corresponding to the opaque areas S21. The transmission area S23 transmits ultraviolet rays during the exposure process. After the development process, the first photoresist pattern 231 formed on predetermined areas of the insulation layer 49 is removed, where first, second and third contact holes 41, 43 and 51 are to be formed.

Figure 9B:
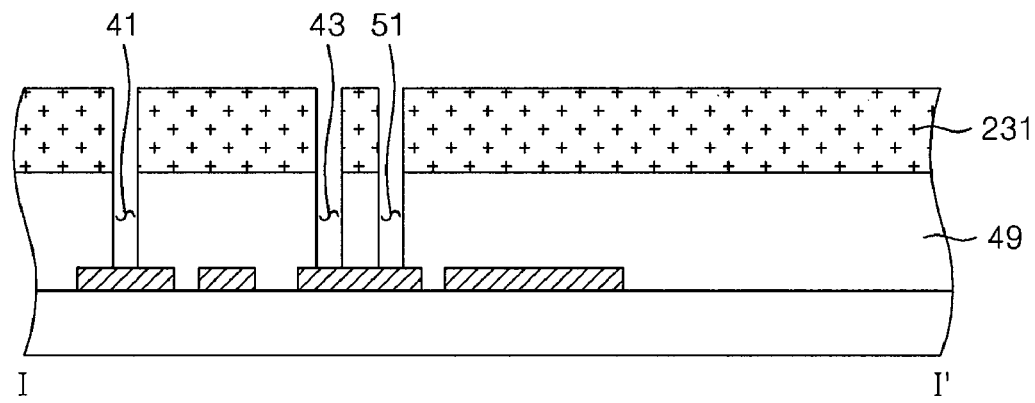
Figure 9C:
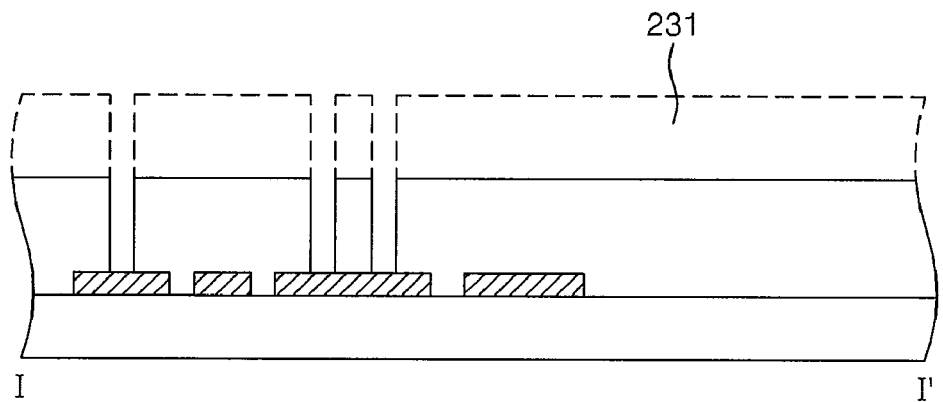

Referring to FIG. 9B, the first, second and third contact holes 41, 43 and 51 are formed by patterning the insulation layer 49 in the transmission area S23 with an etching process using the first photoresist pattern 231 as a mask. Next, the first photoresist pattern 231 is removed by an etching process as shown in FIG. 9C.

Figure 9D:
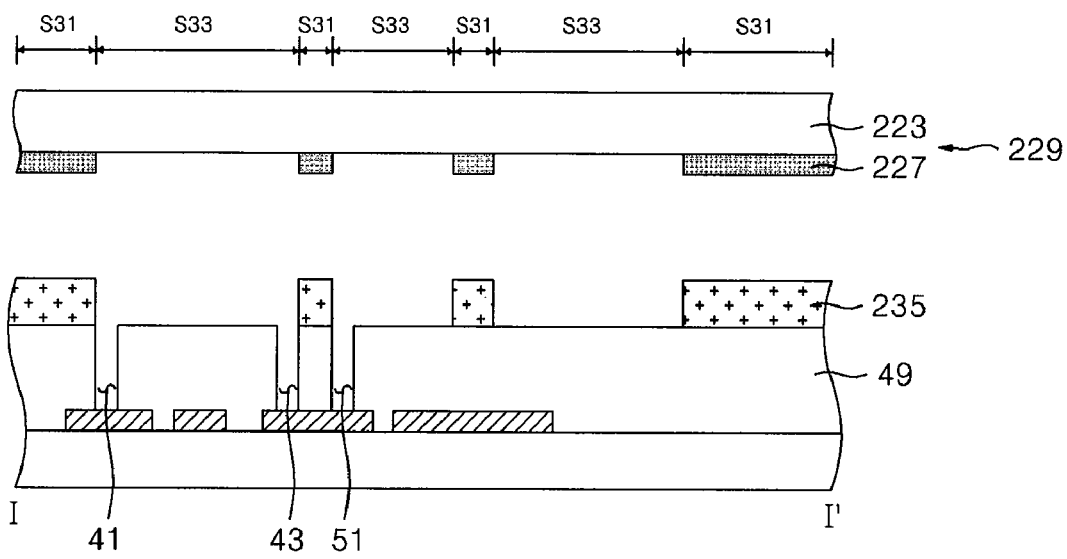

Referring to FIG. 9D, the photoresist layer is deposited on the insulation layer 49 having the first, second and third contact holes 41, 43 and 51. A second mask 229 is arranged over the photoresist layer. The photoresist layer is subject to exposure and development processes by a photolithography process using the second mask 229, thereby forming a second photoresist pattern 235. The second photoresist pattern 235 includes an opaque area S31 in which a blocking layer 227 is formed on a quartz substrate 223, and a transmission area S33 in which only the quartz substrate 223 exists. The opaque area S31 cuts off ultraviolet rays during the exposure process.

After the development process, the second photoresist pattern 235 remains on the insulation layer 49 of areas corresponding to the opaque areas S31. The transmission area S33 transmits ultraviolet rays during the exposure process. After the development process, the second photoresist pattern 235 formed on predetermined areas of the insulation layer 49 is removed, where a connecting groove 45, a source-seating groove 53, and a drain-seating groove 57 are to be formed.

Figure 9E:
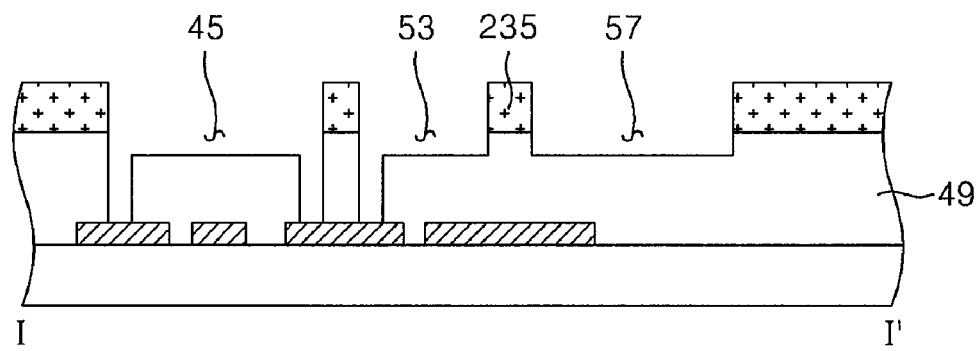
Figure 9F:
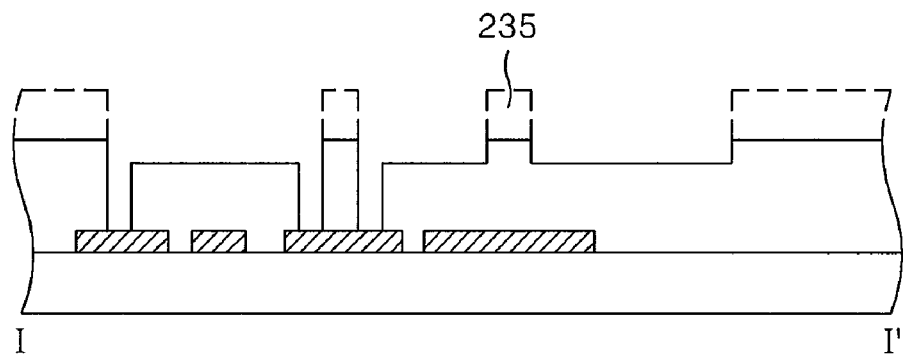

Referring to FIG. 9E, the connecting groove 45, the source-seating groove 53, and the drain-seating groove 57 are formed by etching the insulation layer 49 in the transmission area S33 with a dry etching process using the second photoresist pattern 235 as a mask. During the dry etching process, the etching time is adjusted to allow the connecting groove 45, the source-seating groove 43, and the drain-seating groove 57 to have the predetermined thickness. Next, the second photoresist pattern 235 is removed by an etching process as shown in FIG. 9F.

Accordingly, the gate insulation layer 40 including a bridge groove 47, a source-connecting portion 55, and the drain-seating groove 57 is formed on the substrate 10 on which the conductive metal pattern is formed as illustrated shown in FIG. 5 and FIG. 6. The bridge groove 47 includes the first contact hole 41, the second contact hole 43, and the connecting groove 45. The source-connecting portion 55 includes the third contact hole 51 and the source-seating groove 53.

The gate insulation layer has been described as being formed by using two masks, however this disclosure is not limited thereto. For example, the gate insulation layer may be formed using a single mask, for example, a single slit mask.

Figure 10:
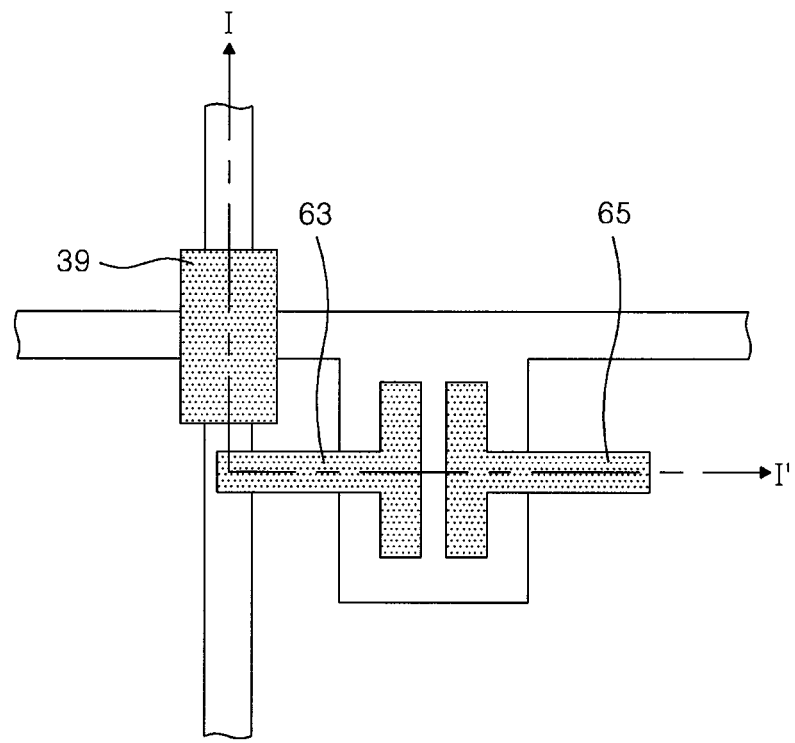
FIG. 10 and FIG. 11 are a plan view and a cross-sectional view, respectively, for describing a data metal pattern, including a data bridge electrode, a source electrode, and a drain electrode forming process according to an exemplary embodiment of the present invention.
Figure 11:
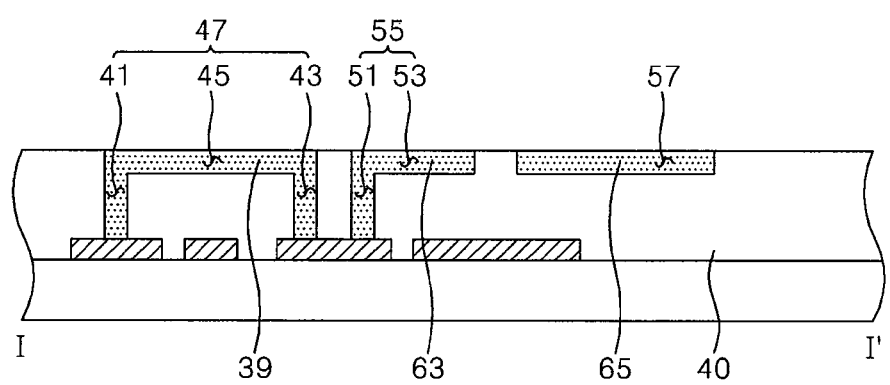

FIG. 10 and FIG. 11 are a plan view and a cross-sectional view, respectively, for describing a data metal pattern, including a data bridge electrode, a source electrode, and a drain electrode forming process according to an exemplary embodiment of the present invention.

Referring to FIG. 10 and FIG. 11, the data metal pattern includes the data bridge electrode 39 formed in a bridge groove 47, the source electrode 63 formed in a source-connecting portion 55, and the drain electrode 65 formed in a drain-seating groove 57. The bridge groove 47 includes a first contact hole 41, a second contact hole 43, and a connecting groove 45. The source-connecting portion 55 includes a third contact hole 51 and a source-seating groove 53.

A liquid conductive material is injected into the bridge groove 47, the source-connecting portion 55, and the drain-seating groove 57 through an ink jet nozzle. The conductive material may be formed of at least one of molybdenum (Mo), niobium (Nb), cupper (Cu), aluminum (Al), chromium (Cr), silver (Ag), tungsten (W), tantalum (Ta), ITO and IZO. The liquid conductive material is hardened, thereby forming the data metal pattern including the data bridge electrode 39, the source electrode 63, and the drain electrode 65.

The data metal pattern has been described as being formed by the ink jet method, however this disclosure is not limited thereto. For example, the data metal pattern may be formed by a mask process including a photolithography process.

Figure 12:
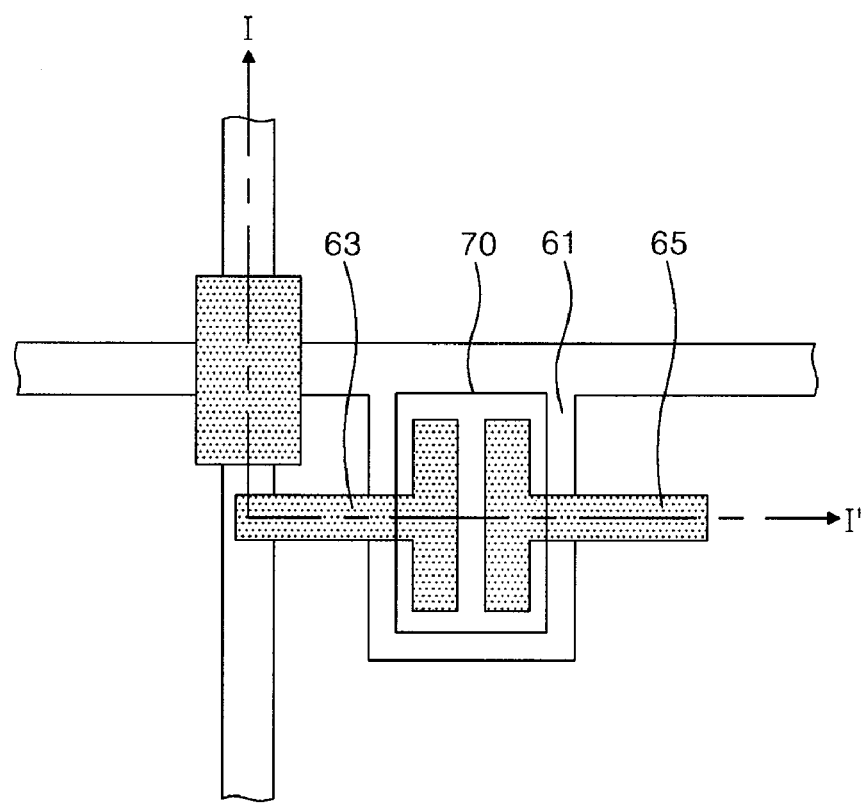
FIG. 12 and FIG. 13 are a plan view and a cross-sectional view, respectively, for describing an organic semiconductor layer forming process according to an exemplary embodiment of the present invention.
Figure 13:
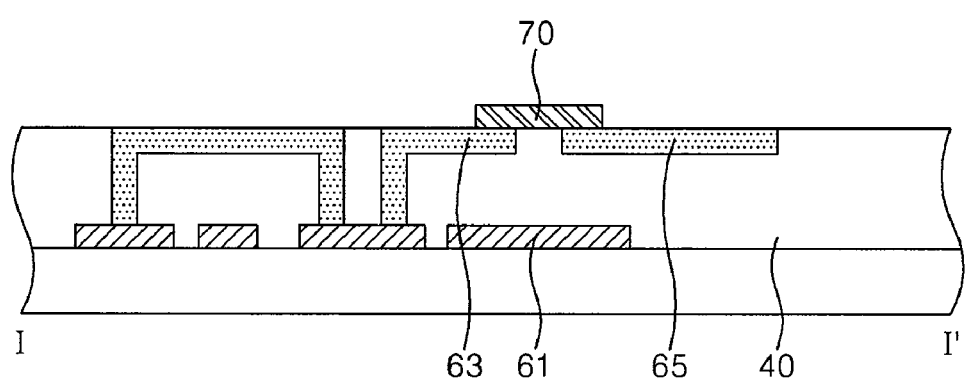

FIG. 12 and FIG. 13 are a plan view and a cross-sectional view, respectively, for describing an organic semiconductor layer forming process according to an exemplary embodiment of the present invention.

Referring to FIG. 12 and FIG. 13, the organic semiconductor layer 70 is formed on the gate insulation layer 40, the source electrode 63, and the drain electrode 65. More specifically, first, the surfaces of the layer 40 and the electrodes 63 and 65 undergo a surface treatment, such as a plasma treatment or SAM process, before the organic semiconductor layer 70 is formed. This treatment leads to equalized contact angles between the organic semiconductor layer 70 and the gate insulation layer 40, between the organic semiconductor layer 70 and the source electrode 63, and between the organic semiconductor layer 70 and the drain electrode 65. Next, an ink jet head (not shown) drops a liquid organic semiconductor on the gate insulation layer 40, the source electrode 63, and the drain electrode 65 while moving on the substrate 10. Then, the liquid organic semiconductor is dried to form the organic semiconductor layer 70.

The contact angle between the organic semiconductor layer 70 and the surface that has undergone the surface treatment becomes different from the contact angle between the organic semiconductor layer 70 and the other surface, and therefore, it can be possible to prevent the liquid organic semiconductor from spreading.

The organic semiconductor layer 70 may be formed by performing a surface treatment on the gate insulation layer 40, the source electrode 63 and the drain electrode 65 without a bank insulation layer having a hole. This results in reduced manufacturing time and cost.

The organic semiconductor layer 70 has been described as being formed by the ink jet method, however this disclosure is not limited thereto. For example, the organic semiconductor layer 70 may be formed by a mask process including a photolithography process.

Figure 14:
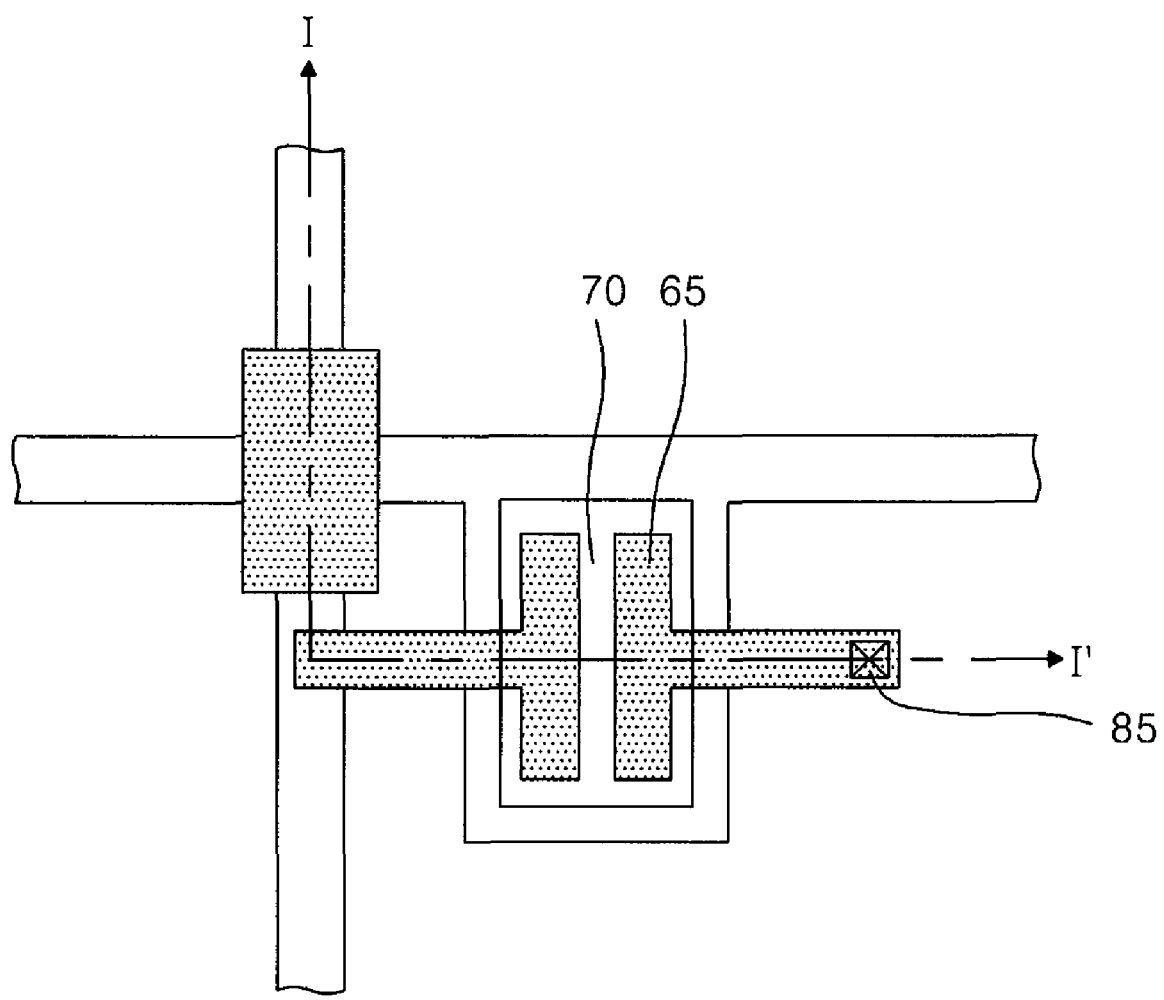
FIG. 14 and FIG. 15 are a plan view and a cross-sectional view, respectively, for describing an organic protective layer forming process according to an exemplary embodiment of the present invention.
Figure 15:
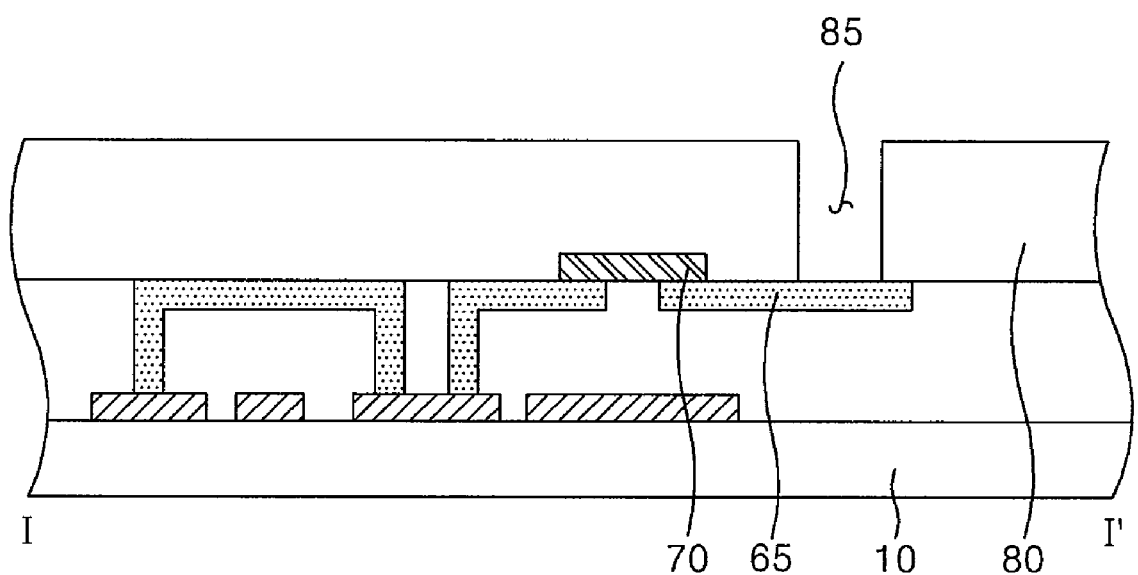

FIG. 14 and FIG. 15 are a plan view and a cross-sectional view, respectively, for describing an organic protective layer forming process according to an exemplary embodiment of the present invention.

Referring to FIG. 14 and FIG. 15, the organic protective layer 80 is formed on the substrate 10 on which the organic semiconductor layer 70 is formed. More specifically, an organic insulation layer is firstly formed on the substrate 10 by a deposition method such as a plasma-enhanced chemical vapor deposition (PECVD) technique. Next, the organic insulation layer is patterned by photolithography and etching processes using a mask to form the organic protective layer 80 having a fourth contact hole 85 through which the drain electrode 65 is exposed.

Figure 16:
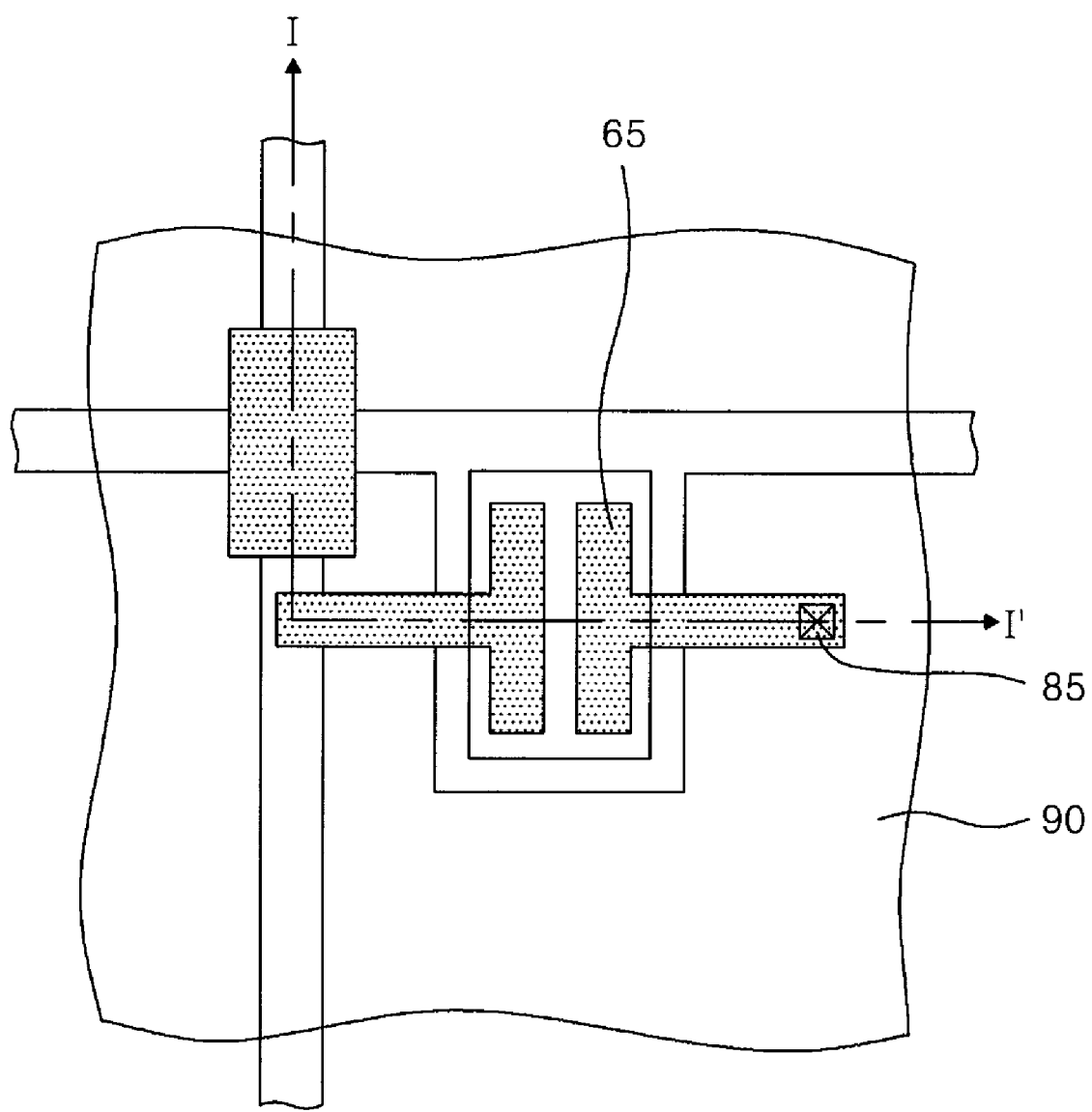
FIG. 16 and FIG. 17 are a plan view and a cross-sectional view, respectively, for describing a pixel electrode forming process according to the exemplary embodiment of the present invention.
Figure 17:
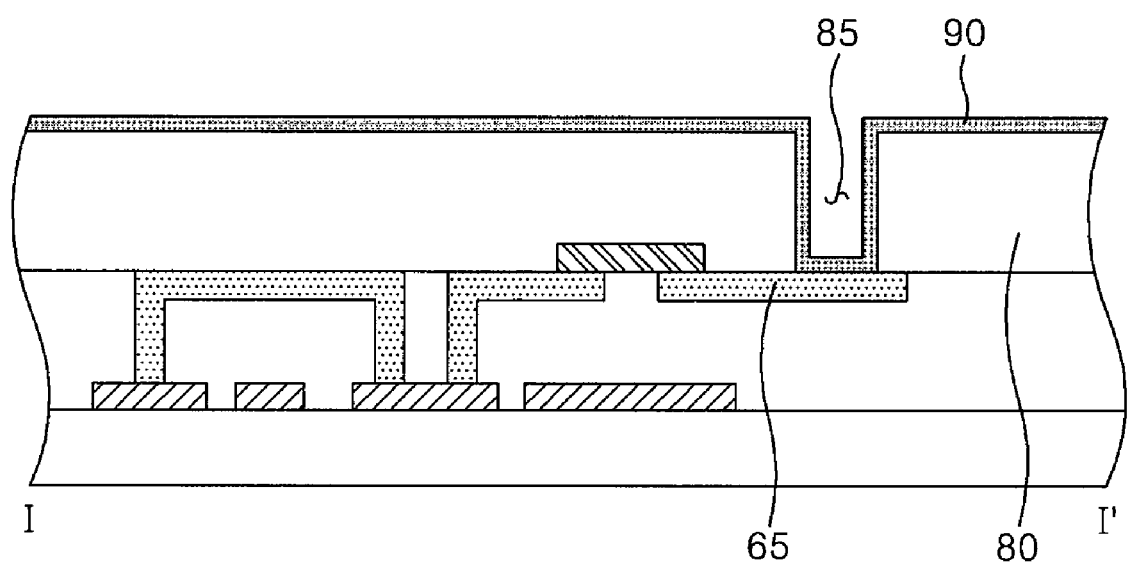

FIG. 16 and FIG. 17 are a plan view and a cross-sectional view, respectively, for describing a pixel electrode forming process according to the exemplary embodiment of the present invention.

Referring to FIGS. 16 and 17, the pixel electrode 90 is formed on the organic protective layer 80. More specifically, a transparent conductive material is deposited by a deposition method, such as a sputtering method, on the organic protective layer 80, thereby to form a transparent conductive layer. The transparent conductive material may include at least one of indium tin oxide (ITO), tin oxide (TO), indium zinc oxide (IZO), indium tin zinc oxide (ITZO) or a combination thereof. The pixel electrode 90 is formed by patterning the transparent conductive layer by photolithography and etching process using a mask. Accordingly, the pixel electrode 90 is electrically connected to a portion of the drain electrode 65 through the fourth contact hole 85.

While the invention has been shown and described with reference to a certain preferred embodiment thereof, it will be understood by those skilled in the art that various changes in form and details may be made therein without departing from the spirit and scope of the invention as defined by the appended claims.

What is claimed is:

1. An organic thin film transistor substrate, comprising:
   a gate line formed on a substrate;
   a gate electrode connected to the gate line;
   a data line comprising a first data line and a second data line disconnected from each other, formed on the substrate, and insulated from the gate line;
   a gate insulation layer formed on the gate electrode, the gate line, and the data line, the gate insulation layer having a source-connecting portion and a drain-seating groove, which are recessed from a surface of the gate insulating layer, and having a third contact hole to expose a portion of the data line;
   a source electrode formed in the source-connecting portion;
   a drain electrode formed in the drain-seating groove;
   an organic semiconductor layer contacting the gate insulation layer, the source electrode and the drain electrode, and
   wherein the gate insulation layer has a bridge groove recessed from the surface of the gate insulation layer, and a data bridge electrode formed in the bridge groove to connect the first data line and the second data line.

2. The organic thin film transistor substrate of claim 1, wherein surfaces of the gate insulation layer, the source electrode and the drain electrode that contact the organic semiconductor layer are substantially formed on a same plane.

3. The organic thin film transistor substrate of claim 1, further comprising:
   the source electrode connected to the data line; and
   a pixel electrode connected to the drain electrode.

4. The organic thin film transistor substrate of claim 3, wherein the source-connecting portion has a source-seating groove recessed from the surface of the gate insulation layer and connected to the third contact hole and facing the drain-seating groove.

5. The organic thin film transistor substrate of claim 1, wherein the bridge groove formed in the gate insulation layer includes first and second contact holes to expose portions of the first and the second data lines, respectively; and
   a connecting groove recessed from the surface of the gate insulation layer,
   wherein the first data line is connected to the second data line through the first and second contact holes and the first contact hole is connected to the second contact hole through the connecting groove.

6. The organic thin film transistor substrate of claim 1, further comprising an organic protective layer that has a fourth contact hole exposing a portion of the drain electrode.

7. A method of manufacturing an organic thin film transistor substrate, comprising:
   forming a gate line, a gate electrode, and a data line having a first data line and a second data line disconnected from each other on a substrate;
   forming a gate insulation layer on the gate electrode, the gate line, and the date line, the gate insulation layer having a source-connecting portion and a drain-seating groove, which are recessed from a surface of the gate insulating layer, and having a third contact hole to expose a portion of the data line;
   forming a source electrode in the source-connecting portion;
   forming a drain electrode in the drain-seating groove;
   forming an organic semiconductor layer to be connected to the source electrode and the drain electrode,
   forming a bridge groove recessed from the surface of the gate insulation layer; and
   forming a data bridge electrode in the bridge groove to connect the first data line and the second data line.

8. The method of claim 7, wherein the forming the gate insulation layer comprises preparing the bridge groove, the source-connecting portion and the drain-seating groove in the gate insulating layer.

9. The method of claim 8, wherein the forming the gate insulation layer comprises:
   forming an insulation layer by depositing an insulation material on the gate electrode;
   arranging an imprint mold having a different thickness over the insulation layer;
   pressurizing and removing the imprint mold; and
   removing the insulation layer remaining in areas where the bridge groove, the source-connecting portion, and the drain-seating groove are to be formed by using an etching process to form a bridge groove, a source-connecting portion, and a drain-seating groove.

10. The method of claim 8, wherein the forming the gate insulation layer comprises:
    forming an insulation layer by depositing an insulation material on the gate electrode;
    forming a resin layer on the insulation layer;
    arranging an imprint mold over the resin layer;
    pressurizing the imprint mold to form a resin pattern having a different thickness;
    removing the imprint mold; and
    etching the insulation layer using the resin pattern to form the bridge groove, the source-connecting portion and the drain-seating groove.

11. The method of claim 8, wherein the forming the gate insulation layer comprises;
    forming an insulation layer by depositing an insulation material on the gate electrode;
    etching the insulation layer using a first mask formed on the insulation layer to form first, second, and third contact holes through which the data line is exposed; and
    etching the insulation layer having the first, second and third contact holes using a second mask formed on the insulation layer to form a connecting groove, a source-seating groove, and a drain-seating groove.

12. The method of claim 8, wherein the forming the source electrode and the drain electrode comprises forming a bridge electrode, the source electrode, and the drain electrode in the bridge groove, the source-connecting portion, and the drain-seating groove, respectively.

13. The method of claim 7, further comprising surface processing the gate insulation layer, the source electrode, and the drain electrode after the forming the source and drain electrodes.

14. The method of claim 13, wherein the surface processing comprises performing a plasma treatment on the surface of the gate insulation layer, the source electrode, and the drain electrode with supplying a gas containing fluorine (F).

15. The method of claim 13, wherein the surface processing comprises self-assembled monolayer (SAM)-processing of the surfaces of the gate insulation layer, the source electrode, and the drain electrode.

16. The method of claim 7, further comprising forming an organic protective layer having a fourth contact hole through which a portion of the drain electrode is exposed.

* * * * *